(12) United States Patent
Kim et al.

(10) Patent No.: US 9,466,646 B2
(45) Date of Patent: Oct. 11, 2016

(54) ON-CELL TSP ACTIVE MATRIX ORGANIC LIGHT EMITTING DIODE STRUCTURE

(75) Inventors: Dong Sub Kim, Suwon-si (KR); Sang Yong Eom, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 700 days.

(21) Appl. No.: 13/213,715

(22) Filed: Aug. 19, 2011

(65) Prior Publication Data
US 2012/0044181 A1    Feb. 23, 2012

(30) Foreign Application Priority Data

Aug. 23, 2010  (KR) .................. 10-2010-0081523

(51) Int. Cl.
| | | |
|---|---|---|
| *G06F 3/041* | (2006.01) | |
| *G02F 1/1339* | (2006.01) | |
| *G02F 1/167* | (2006.01) | |
| *G02F 1/1345* | (2006.01) | |
| *C23C 14/06* | (2006.01) | |
| *C09K 19/54* | (2006.01) | |
| *H01L 51/52* | (2006.01) | |
| *G06F 1/16* | (2006.01) | |
| *G06F 3/045* | (2006.01) | |
| *H01L 27/32* | (2006.01) | |

(52) U.S. Cl.
CPC ........... *H01L 27/323* (2013.01); *G06F 1/1626* (2013.01); *G06F 3/0412* (2013.01); *H01L 51/5281* (2013.01)

(58) Field of Classification Search
CPC .. G02F 1/1333; G02F 1/13338; G02F 1/167; G06F 3/0412; G06F 3/045
USPC .......... 174/261; 345/52, 107, 169, 173–174, 345/206; 428/195.1, 194; 348/794; 257/40; 313/504, 512; 361/679.21, 727, 809; 362/97.3; 455/575.4; 359/485
See application file for complete search history.

(56) References Cited

U.S. PATENT DOCUMENTS

| | | | |
|---|---|---|---|
| 6,288,764 B1* | 9/2001 | Zhang | G02F 1/1339 349/152 |
| 7,378,685 B2* | 5/2008 | Lee | G02F 1/13452 257/678 |
| 2006/0108562 A1* | 5/2006 | Fukai | C09K 19/54 252/299.5 |
| 2007/0057907 A1 | 3/2007 | Ishii et al. | |
| 2007/0290196 A1 | 12/2007 | Fischer et al. | |
| 2008/0117143 A1 | 5/2008 | Kim | |
| 2008/0165139 A1* | 7/2008 | Hotelling et al. | ............ 345/173 |
| 2008/0246741 A1* | 10/2008 | Hinata | G06F 3/045 345/173 |
| 2008/0310020 A1* | 12/2008 | Hashimoto et al. | .......... 359/485 |
| 2009/0050876 A1 | 2/2009 | Marks et al. | |

(Continued)

FOREIGN PATENT DOCUMENTS

EP    2180536 A2    4/2010

*Primary Examiner* — Lin Li
(74) *Attorney, Agent, or Firm* — Jefferson IP Law, LLP

(57) ABSTRACT

An on-cell Touch Screen Panel (TSP) Active Matrix Organic Light Emitting Diode (AMOLED) structure is provided. The on-cell TSP AMOLED structure includes an AMOLED, a display driver for driving the AMOLED, a display driver reinforcing material positioned at an upper part of the display driver, and a window positioned at an upper part of the display driver reinforcing material, wherein a resin or Optical Clear Adhesive (OCA) is applied between an upper surface of the display driver reinforcing material and a lower surface of the window. Therefore, separation and twist of a display driver reinforcing material can be prevented.

17 Claims, 5 Drawing Sheets

(56) References Cited

U.S. PATENT DOCUMENTS

| | | | |
|---|---|---|---|
| 2009/0184919 A1* | 7/2009 | Shinn | G02F 1/167 345/107 |
| 2009/0213534 A1* | 8/2009 | Sakai | 361/679.21 |
| 2010/0039390 A1* | 2/2010 | Iohara | G06F 3/0202 345/169 |
| 2010/0053854 A1* | 3/2010 | Nishikawa | G06F 1/1626 345/173 |
| 2010/0085326 A1 | 4/2010 | Anno | |
| 2010/0085426 A1 | 4/2010 | Diehr et al. | |
| 2010/0110040 A1* | 5/2010 | Kim | G06F 3/0412 345/174 |
| 2010/0220072 A1* | 9/2010 | Chien | G06F 3/041 345/173 |
| 2010/0244005 A1* | 9/2010 | Gyoda | H01L 51/5237 257/40 |
| 2010/0294535 A1* | 11/2010 | Koezuka | C23C 14/0676 174/126.1 |

* cited by examiner

US 9,466,646 B2

ON-CELL TSP ACTIVE MATRIX ORGANIC LIGHT EMITTING DIODE STRUCTURE

PRIORITY

This application claims the benefit under 35 U.S.C. §119(a) of a Korean patent application filed on Aug. 23, 2010 in the Korean Intellectual Property Office and assigned Serial No. 10-2010-0081523, the entire disclosure of which is hereby incorporated by reference.

BACKGROUND OF THE INVENTION

1. Field of the Invention

The present invention relates to an on-cell Touch Screen Panel (TSP) Active Matrix Organic Light Emitting Diode (AMOLED) structure. More particularly, the present invention relates to an on-cell TSP AMOLED structure in which a resin is formed between an AMOLED and a window.

2. Description of the Related Art

In order to increase a display area while reducing a weight and a thickness of a mobile terminal, a touch screen technology is applied to the mobile terminal. Such touch screen technology is realized using a Touch Screen Panel (TSP) and a display such as a Liquid Crystal Display (LCD) or an Active Matrix Organic Light Emitting Diode (AMOLED). A touch screen technology using an AMOLED having a high optical characteristic is increasingly available.

FIG. 1 is a partial cross-sectional view illustrating a TSP AMOLED structure according to the related art.

Referring to FIG. 1, a TSP AMOLED structure 100 is shown. A TSP Indium Tin Oxide (ITO) film (not shown) is formed in a lower surface of a window 150, and an air gap 140 exists between the window 150 and a polarizing plate 130 formed in an upper surface of an AMOLED 120. The AMOLED 120 includes Low Temperature Polycrystalline Silicon (LTPS) glass 121 made of a light emitting organic material to perform self light emission and encap glass 122 for sealing an upper part of the LTPS glass 121. Also, a sponge 110 for absorbing an external impact is disposed at a lower surface of the LTPS glass 121. Further, a display driver 170 such as an LCD Driver Integrated circuit (LDI) is included. A Flexible Printed Circuit board (FPCB) 160 connected to a main board (not shown) to transfer a control signal to the display driver 170 is formed at an upper surface of the LTPS glass 121 and at a side portion of the display driver 170. In the TSP AMOLED structure 100 of FIG. 1, because of reflection due to a refractive index difference between the air gap 140 and the TSP ITO film or the window 150, it is difficult to view a clear screen under strong external light.

In order to address such a problem, an on-cell TSP AMOLED structure was developed. The on-cell TSP AMOLED structure is described below with reference to FIG. 2.

FIG. 2 is a partial cross-sectional view illustrating an on-cell TSP AMOLED structure according to the related art.

Referring to FIG. 2, an on-cell TSP AMOLED structure 200 is shown. A TSP ITO pattern (not shown) is formed between a polarizing plate 230 and an AMOLED 220, and a resin 240 is applied between the polarizing plate 230 and a window 250. The AMOLED 220 includes LTPS glass 221 made of a light emitting organic material to perform self light emission and encap glass 222 for sealing an upper part of the LTPS glass 221. Also, a sponge 210 for absorbing an external impact is disposed at a lower surface of the LTPS glass 221. Further, a display driver reinforcing material 280 for protecting a display driver 270 such as an LDI is positioned at an upper part of the display driver 270. A FPCB 260 connected to a main board (not shown) to transfer a control signal to the display driver 270 is formed at an upper surface of the LTPS glass 221 and at a side portion of the display driver 270. However, in the on-cell TSP AMOLED structure 200, because the display driver reinforcing material 280 may be separated or twisted due to an external impact, the display driver 270 may be weakly protected.

SUMMARY OF THE INVENTION

Aspects of the present invention are to address the above-mentioned problems and/or disadvantages and to provide at least the advantages described below. Accordingly an aspect of the present invention is to provide an on-cell Touch Screen Panel (TSP) Active Matrix Organic Light Emitting Diode (AMOLED) structure that can prevent separation and twist of a display driver reinforcing material for protecting a display driver.

In accordance with an aspect of the present invention, an on-cell TSP AMOLED structure is provided. The structure includes an AMOLED, a display driver for driving the AMOLED, a display driver reinforcing material positioned at an upper part of the display driver, and a window positioned at an upper part of the display driver reinforcing material, wherein a resin or optical clear adhesive (OCA) is applied between an upper surface of the display driver reinforcing material and a lower surface of the window.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which.

Throughout the drawings, it should be noted that like reference numbers are used to depict the same or similar elements, features, and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 3:
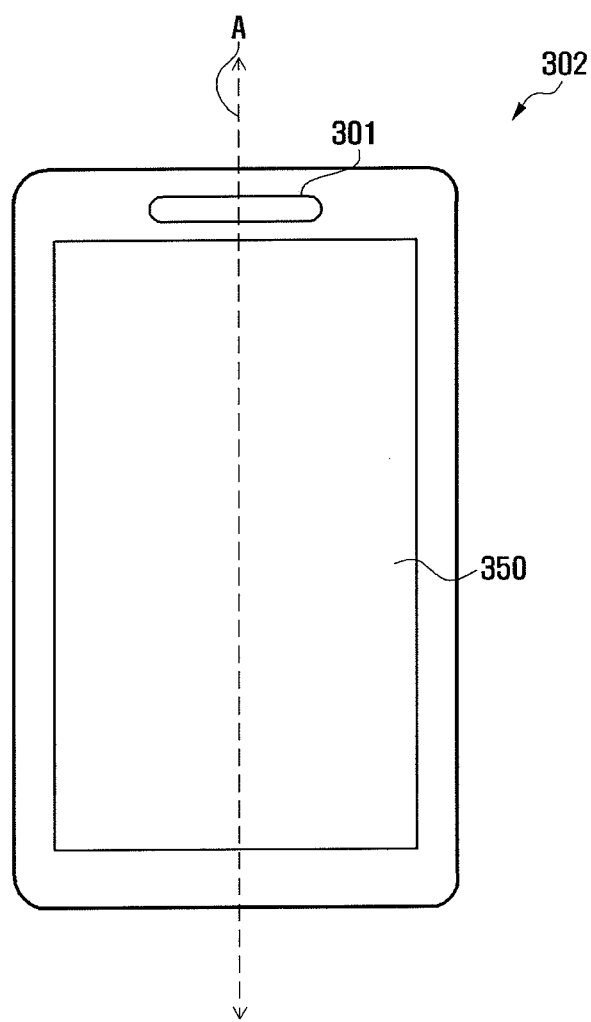
FIG. 3 is a plan view illustrating a mobile terminal having an on-cell TSP AMOLED structure according to an exemplary embodiment of the present invention.
Figure 4:
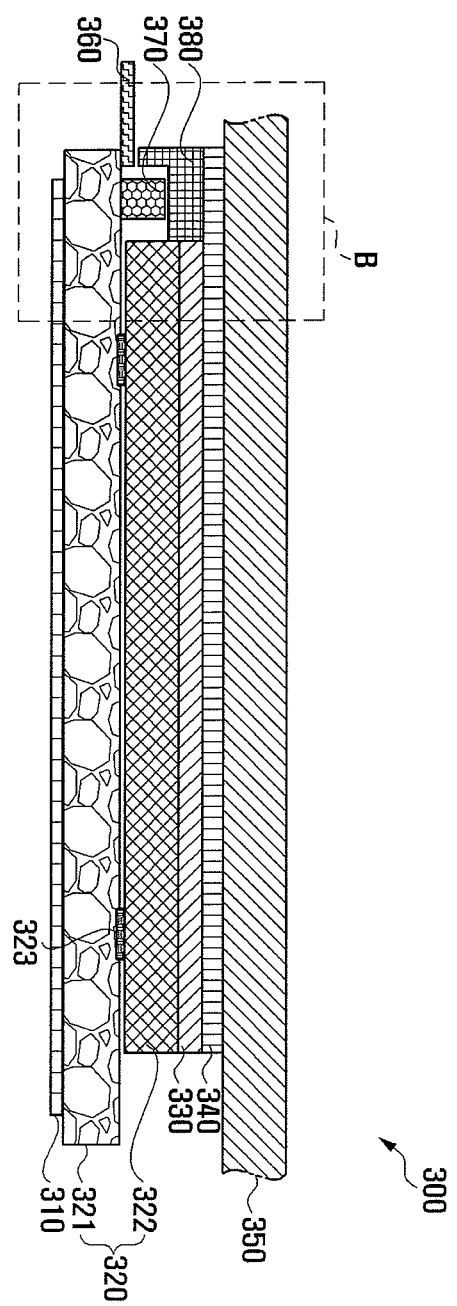
FIG. 4 is a cross-sectional view illustrating an on-cell TSP AMOLED structure taken along a dotted line A of FIG. 3 according to an exemplary embodiment of the present invention.
Figure 5:
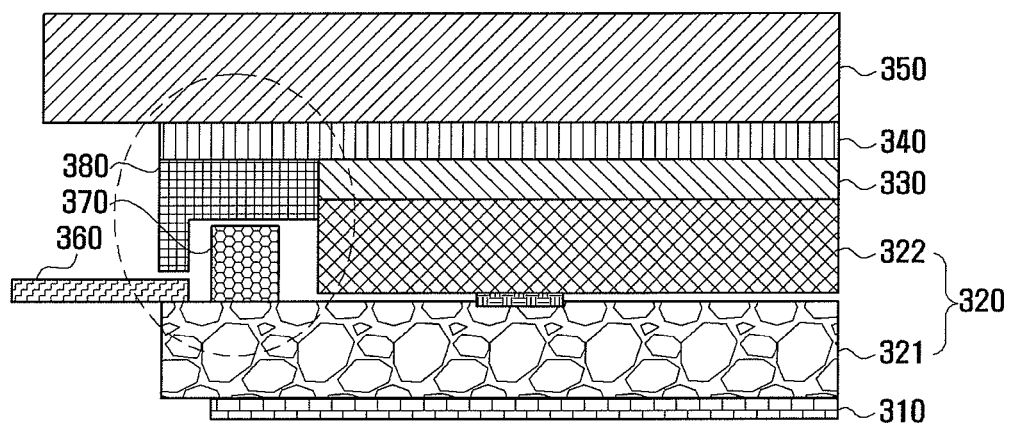
FIG. 5 is a partially enlarged cross-sectional view illustrating an on-cell TSP AMOLED structure within a dotted line B of FIG. 4 according to an exemplary embodiment of the present invention.

FIG. 3 is a plan view illustrating a mobile terminal having an on-cell Touch Screen Panel (TSP) Active Matrix Organic Light Emitting Diode (AMOLED) structure according to an exemplary embodiment of the present invention. FIG. 4 is a cross-sectional view illustrating an on-cell TSP AMOLED structure taken along a dotted line A of FIG. 3 according to an exemplary embodiment of the present invention. FIG. 5 is-a partially enlarged cross-sectional view illustrating an on-cell TSP AMOLED structure within a dotted line B of FIG. 4 according to an exemplary embodiment of the present invention. For reference, the dotted line A of FIG. 3 passes through a vertical direction along the center of a window 350 and a speaker hole 301 of a mobile terminal 302.

Referring to FIGS. 3 to 5, an on-cell TSP AMOLED structure 300 according to an exemplary embodiment of the present invention is described. The on-cell TSP AMOLED structure 300 includes an AMOLED 320, display driver 370, display driver reinforcing material 380, and window 350.

The AMOLED 320 includes Low Temperature Polycrystalline Silicon (LTPS) glass 321 made of a light emitting organic material to perform self light emission and encap glass 322 for sealing an upper part of the LTPS glass 321. Space between a lower surface of the encap glass 322 and an upper surface of the LTPS glass 321 is sealed by a cell seal 323 formed with metal glass, and the sealed space is filled with nitrogen gas. Further, a polarizing plate 330 for preventing external light from being reflected from the AMOLED 320 is formed in an upper part of the encap glass 322. A TSP Indium Tin Oxide (ITO) pattern (not shown) is formed between an upper surface of the encap glass 322 and a lower surface of the polarizing plate 330. A sponge 310 for absorbing an external impact is disposed at a lower surface of the LTPS glass 321.

The display driver 370 for driving the AMOLED 320 is positioned at an upper surface of one side of the LTPS glass 321. It is preferable that the display driver 370 be a Liquid Crystal Display (LCD) Driver Integrated circuit (LDI). Further, a Flexible Printed Circuit board (FPCB) 360 connected to a main board (not shown) to transfer a control signal to the display driver 370 is formed at an upper surface of the LTPS glass 321 and at a side portion of the display driver 370.

The display driver reinforcing material 380 for protecting the display driver 370 is positioned at an upper part of the display driver 370. It is preferable that the display driver reinforcing material 380 is formed with polyethylene terephthalate (PET). Further, as shown in FIG. 5, it is preferable that the display driver reinforcing material 380 contacts with a side surface of the polarizing plate 330, and an upper surface of the display driver reinforcing material 380 and an upper surface of the polarizing plate 330 form one plane. Further, although not shown in FIGS. 3 to 5, an upper surface of the LTPS glass 321 supports a lower end of the display driver reinforcing material 380.

The resin 340 is applied to an upper surface of the display driver reinforcing material 380 and the polarizing plate 330. The window 350 is disposed at an upper surface of the resin 340. It is preferable that the window 350 is formed with glass or acryl. In the present exemplary embodiment, the resin 340 is applied at an upper surface of the polarizing plate 330 and the display driver reinforcing material 380; however an Optical Clear Adhesive (OCA) may be applied instead of a resin.

According to the present exemplary embodiment, by applying the resin 340 between an upper surface of the display driver reinforcing material 380 and a lower surface of the window 350, the driver reinforcing material 380 is prevented from being separated or twisted by an external impact, thereby more securely protecting a display driver.

Figure 1:
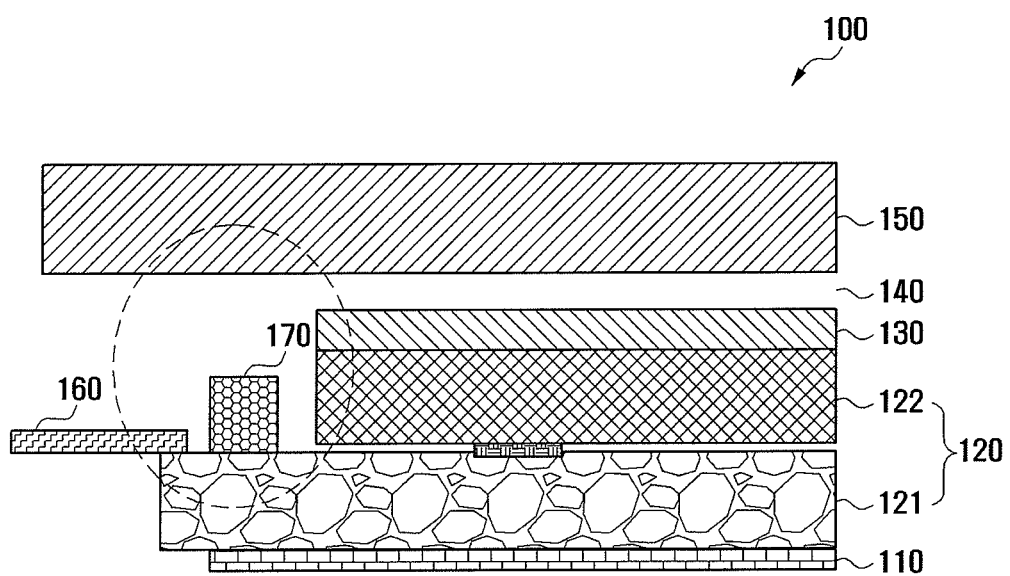
FIG. 1 is a partial cross-sectional view illustrating a Touch Screen Panel (TSP) Active Matrix Organic Light Emitting Diode (AMOLED) structure according to the related art.
Figure 2:
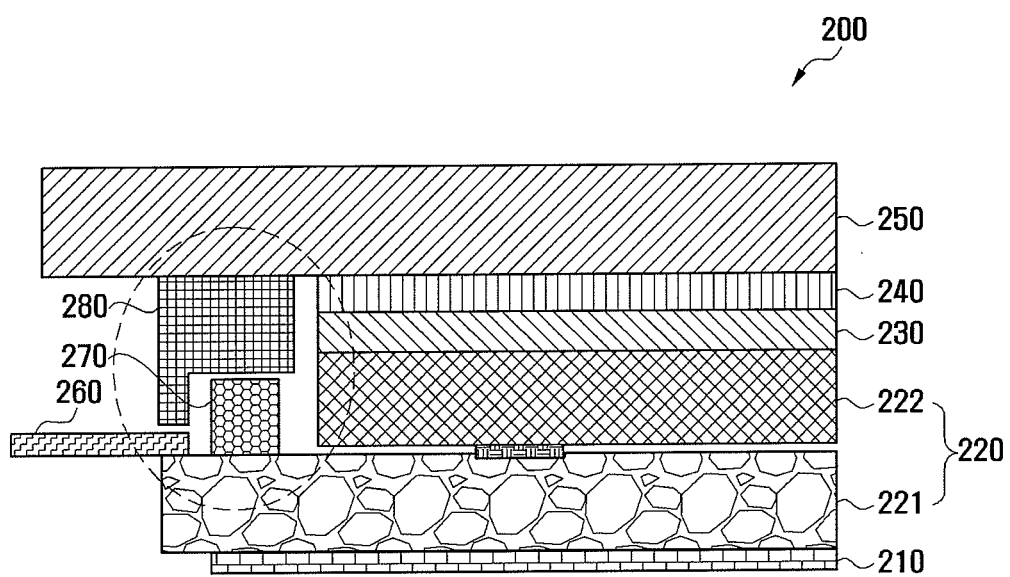
FIG. 2 is a partial cross-sectional view illustrating an on-cell TSP AMOLED structure according to the related art.

Referring again to FIG. 2, in the on-cell TSP AMOLED structure 200 of the related art, when the display driver reinforcing material 280 is separated by an external impact, a load of the window 250 is converged at a cell seal of the AMOLED 220 through a resin. However, because the cell seal has a width of 450 to 500 µm, the load is converged to a very narrow area and thus the AMOLED 220 is at risk for being damaged. However, according to the present exemplary embodiment, because the display driver reinforcing material 380 is prevented from being separated by the resin 340 applied between an upper surface of the display driver reinforcing material 380 and a lower surface of the window 350, a load of the window 350 is dispersed to the display driver reinforcing material 380 and thus the risk of the AMOLED 320 being damaged can be lowered.

As described above, according to exemplary embodiments of the present invention, by forming a resin or OCA between an upper surface of a display driver reinforcing material and a lower surface of a window, separation and twist of the display driver reinforcing material can be prevented. Accordingly, the display driver can be more surely protected, and a risk of an AMOLED being damaged can be lowered.

While the invention has been shown and with reference to certain exemplary embodiments thereof, it will be understood that many various changes in form and details may be made therein without departing from the spirit and scope of the invention as defined by the appended claims and their equivalents.

What is claimed is:

1. An on-cell Touch Screen Panel (TSP) Active Matrix Organic Light Emitting Diode (AMOLED) structure, the structure comprising:
   an AMOLED;
   a display driver positioned outside a peripheral edge in plan view of an encap glass of the AMOLED, for driving the AMOLED;
   a display driver reinforcing material positioned at an upper part of the display driver;
   a polarizing plate disposed on and essentially coextensive with an upper surface of the encap glass of the AMOLED, wherein the display driver reinforcing material contacts a peripheral edge of the polarizing plate and a peripheral edge of the encap glass, and wherein an upper surface of the polarizing plate and an upper surface of the display driver reinforcing material form one substantially planar surface;

a resin or Optical Clear Adhesive (OCA) disposed on the substantially planar surface and extending over the polarizing plate and the display driver reinforcing material; and a window comprising glass or acryl and extending over an upper part of the display driver reinforcing material, the polarizing plate, and the encap glass, wherein a surface of the window is substantially parallel to the encap glass, wherein the resin or Optical Clear Adhesive (OCA) is disposed between the substantially planar surface and a lower surface of the window, and wherein the structure is configured such that a load of the window is dispersed to the display driver reinforcing material.

2. The structure of claim 1, wherein the resin or OCA applied between the upper surface of the display driver reinforcing material and the lower surface of the window is also applied between an upper surface of the polarizing plate and the lower surface of the window.

3. The structure of claim 1, further comprising a TSP Indium Tin Oxide (ITO) pattern formed between an upper surface of the AMOLED and a lower surface of the polarizing plate.

4. The structure of claim 1, wherein the AMOLED comprises a Low Temperature Polycrystalline Silicon (LTPS) glass and the encap glass.

5. The structure of claim 4, further comprising a Flexible Printed Circuit Board (FPCB) connected to a main board to transfer a control signal to the display driver, which is formed at an upper surface of the LTPS glass and at side portion of the display driver.

6. The structure of claim 4, wherein the display driver is positioned at an upper surface of one side of the LTPS glass.

7. The structure of claim 1, wherein the display driver comprises a Liquid Crystal Display (LCD) Driver Integrated circuit (LDI).

8. The structure of claim 1, wherein the display driver reinforcing material comprises polyethylene terephthalate (PET).

9. The structure of claim 1, wherein the window comprises one of glass and acryl.

10. The structure of claim 1, further comprising a sponge disposed at a lower surface of the AMOLED.

11. An on-cell Touch Screen Panel (TSP) Active Matrix Organic Light Emitting Diode (AMOLED) structure, the structure comprising:

a window comprising glass or acryl;

an AMOLED including a Low Temperature Polycrystalline Silicon (LTPS) glass and an encap glass;

a polarizing plate disposed between the window and the encap glass, and essentially coextensive with an upper surface of the encap glass;

a display driver configured to drive the AMOLED and positioned outside a peripheral edge in plan view of the encap glass and at an upper surface of one side of the LTPS glass; and a display driver reinforcing material positioned between the window and the display driver, a side of the display driver reinforcing material abutting a peripheral edge of the polarizing plate and a peripheral edge of the encap glass, wherein an upper surface of the polarizing plate and an upper surface of the display driver reinforcing material form one substantially planar surface, wherein a surface of the window is substantially parallel to and extends over the encap glass and the display driver reinforcing material, wherein a resin or Optical Clear Adhesive (OCA) is applied between an upper surface of the substantially planar surface and a lower surface of the window, and wherein the structure is configured such that a load of the window is dispersed to the display driver reinforcing material.

12. The structure of claim 11, wherein the display driver reinforcing material contacts a peripheral edge of the polarizing plate.

13. The structure of claim 11, further comprising a TSP Indium Tin Oxide (ITO) pattern formed between an upper surface of the encap glass and a lower surface of the polarizing plate.

14. The structure of claim 11, further comprising a Flexible Printed Circuit board (FPCB) connected to a main board to transfer a control signal to the display driver, which is formed at an upper surface of the LTPS glass and at side portion of the display driver.

15. The structure of claim 11, wherein the display driver reinforcing material comprises polyethylene terephthalate (PET).

16. The structure of claim 11, wherein the window comprises one of glass and acryl.

17. The structure of claim 11, further comprising a sponge disposed at a lower surface of the LTPS glass.

* * * * *